: US 11,013,136 B2
(45) Date of Patent: May 18, 2021

(12) United States Patent
Wang et al.

(54) FIXING DEVICE FOR FIXING A CIRCUIT BOARD AND ELECTRONIC DEVICE FIXING MOUNT WITH THE FIXING DEVICE

(71) Applicant: Wistron Corporation, New Taipei (TW)

(72) Inventors: Jun Hao Wang, New Taipei (TW); Tai-Hsun Wu, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 16/392,560

(22) Filed: Apr. 23, 2019

(65) Prior Publication Data

US 2020/0267866 A1    Aug. 20, 2020

(30) Foreign Application Priority Data

Feb. 18, 2019 (CN) .......................... 201910120098.7

(51) Int. Cl.
*H05K 7/14* (2006.01)
*H05K 1/02* (2006.01)
*H05K 1/18* (2006.01)

(52) U.S. Cl.
CPC ......... *H05K 7/1427* (2013.01); *H05K 1/0298* (2013.01); *H05K 1/181* (2013.01)

(58) Field of Classification Search
CPC ...... H05K 7/1427; H05K 1/028; H05K 1/181; H05K 7/1489
See application file for complete search history.

(56) References Cited

U.S. PATENT DOCUMENTS

| | | | |
|---|---|---|---|
| 5,696,746 A * | 12/1997 | Ookawa | G11B 17/0407 720/637 |
| 7,014,508 B2 | 3/2006 | Tsai | |
| 7,033,222 B2 | 4/2006 | Kitamura | |
| 2014/0254086 A1* | 9/2014 | Li | G06F 1/185 361/679.32 |

FOREIGN PATENT DOCUMENTS

CN    102410509 B    7/2014

* cited by examiner

*Primary Examiner* — James Wu
*Assistant Examiner* — Hung Q Dang
(74) *Attorney, Agent, or Firm* — Winston Hsu

(57) ABSTRACT

A fixing device is used for fixing a circuit board and includes a carrier frame and a circuit board supporting structure. The carrier frame includes a guiding part and a guiding slot. The circuit board supporting structure includes a sliding part, and a supporting part and a positioning part which are disposed on the sliding part. The sliding part has a guided portion slidably engaged with the guiding part. The positioning part slides in the guiding slot and is adjustably fixed at a first position or a second position of the guiding slot, so that the fixing device can fix different circuit boards through the circuit board supporting structure. An electronic device fixing mount includes a structural frame, and a connector and the above fixing device which are disposed on the structural frame. A circuit board fixed on the fixing device can be connected with the connector.

18 Claims, 9 Drawing Sheets

US 11,013,136 B2

FIXING DEVICE FOR FIXING A CIRCUIT BOARD AND ELECTRONIC DEVICE FIXING MOUNT WITH THE FIXING DEVICE

BACKGROUND OF THE INVENTION

1. FIELD OF THE INVENTION

The present invention relates to a fixing device for fixing a circuit board.

2. DESCRIPTION OF THE PRIOR ART

The circuit board fixing structure inside an electronic device is usually designed for a single kind of circuit boards, e.g. for the positions of fixing holes thereof. If other circuit boards are required to be installed to the electronic device, the fixing structure needs structural modification that will increase the cost. Some fixing structures are provided in a combination design for convenience of attaching and detaching circuit boards. For example, a circuit board is fixed on a carrier plate. Then, the carrier plate together with the circuit board is fixed in the electronic device. If another circuit board of different kind needs to be installed to the electronic device instead, a corresponding carrier plate is required in principle. In other words, to replace with different kind of circuit boards needs to abandon the original carrier plate and buy a new one, which leads to a waste and a cost increase.

SUMMARY OF THE INVENTION

The present disclosure provides a fixing device, which can offer different fixing positions by adjusting the relative position of a sliding part, so as to adapt to circuit boards with various fixing hole positions.

A fixing device according to an embodiment includes a carrier frame and a circuit board supporting structure. The carrier frame includes a guiding part and a guiding slot. The circuit board supporting structure is disposed on the carrier frame. The circuit board supporting structure includes a sliding part, a supporting part, and a positioning part. The sliding part has a guided portion slidably engaged with the guiding part. The supporting part and the positioning part are disposed on the sliding part. The positioning part slides in the guiding slot and is adjustably fixed at a first position or a second position of the guiding slot. The fixing device supports and fixes a circuit board through the circuit board supporting structure. By positioning the positioning part at the first position or the second position, the fixing device can adapt to at least two kinds of circuit boards with different fixing hole positions.

The present disclosure also provides an electronic device fixing mount having one like the above fixing device. Thereby, the electronic device fixing mount also can offer different fixing positions by adjusting the relative position of a sliding part of the fixing device, so as to adapt to circuit boards with various fixing hole positions.

An electronic device fixing mount according to an embodiment includes a structural frame, a connector, and a fixing device. The fixing device is disposed on the structural frame. The fixing device includes a carrier frame and a circuit board supporting structure. The carrier frame includes a guiding part and a guiding slot. The circuit board supporting structure is disposed on the carrier frame. The circuit board supporting structure includes a sliding part, a supporting part, and a positioning part. The sliding part has a guided portion slidably engaged with the guiding part. The supporting part and the positioning part are disposed on the sliding part. The positioning part slides in the guiding slot and is adjustably fixed at a first position or a second position of the guiding slot. The connector is disposed on the structural frame close to the fixing device for connecting with a circuit board fixed on the fixing device. Similarly, the fixing device supports and fixes a circuit board through the circuit board supporting structure and is disposed on the structural frame. By positioning the positioning part at the first position or the second position, the fixing device can adapt to at least two kinds of circuit boards with different fixing hole positions.

Compared with the prior art, the fixing device according to the disclosure can offer different fixing positions by adjusting the relative position of the sliding part, so as to adapt to circuit boards with various fixing hole positions. It is unnecessary to buy a new fixing device or partial components thereof once the circuit board is replaced with new one. Furthermore, replacing with different circuit boards requires adjustment only, and no structural modification is required.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
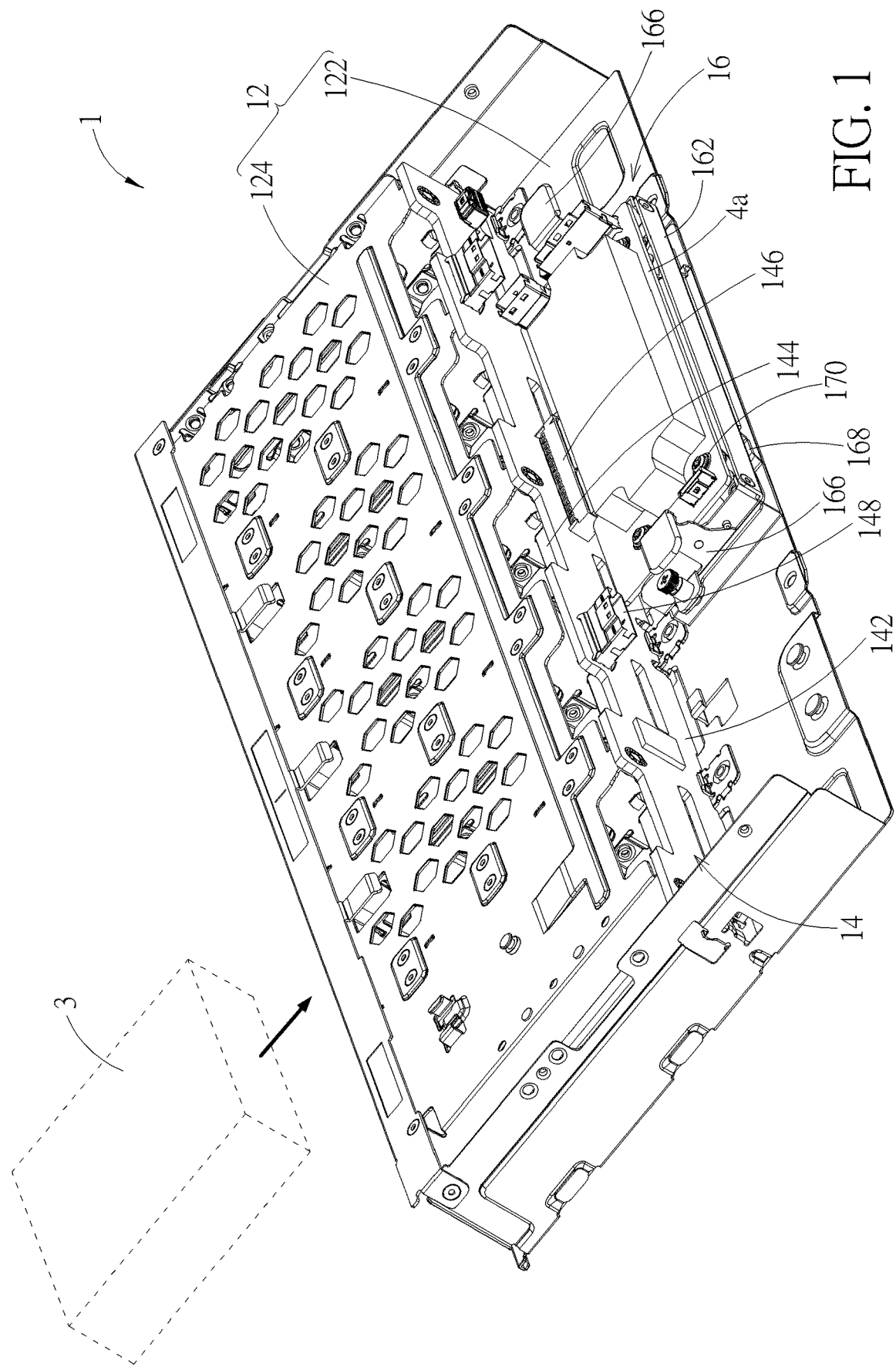
FIG. 1 is a schematic diagram illustrating an electronic device fixing mount according to an embodiment.

Please refer to FIG. 1. An electronic device fixing mount 1 according to an embodiment includes a structural frame 12, a connection module 14, and a fixing device 16. The connection module and the fixing device 16 are installed individually to the structural frame 12. The structural frame 12 includes a bottom plate 122 and a top cover 124. The top cover 124 and the bottom plate 122 are engaged with each other to form an accommodating space for accommodating an electronic device 3 (shown by a rectangle in dashed lines in FIG. 1). The fixing device 16 is installed to the bottom plate 122. The connection module 14 is disposed between the fixing device 16 and the accommodating space. The connection module 14 includes a circuit board 142 and connectors 144 and 146 at two sides of the circuit board 142; therein, the connector 146 is disposed close to the fixing device 16. The electronic device 3 accommodated in the accommodating space is connected to the connected 144. A circuit board 4a can be installed to the fixing device 16 so as to connect with the connector 146 of the connection module 14 to electrically connect with the electronic device 3 accommodated in the accommodating space through the connection module 14. In the embodiment, the electronic device fixing mount 1 can adapt to file servers. The electronic device 3 can be a hard drive, a solid-state drive, or other storage device. The circuit board 4a can be a RAID (Redundant Array of Independent Disks) controller. However, it is not limited thereto. For example, the electronic device fixing mount 1 also can adapt to other electronic devices. The circuit board 4a also can be an expansion card. The structural details of the electronic device fixing mount 1 will be modified according to actual applications, which will not be described in addition.

Figure 2:
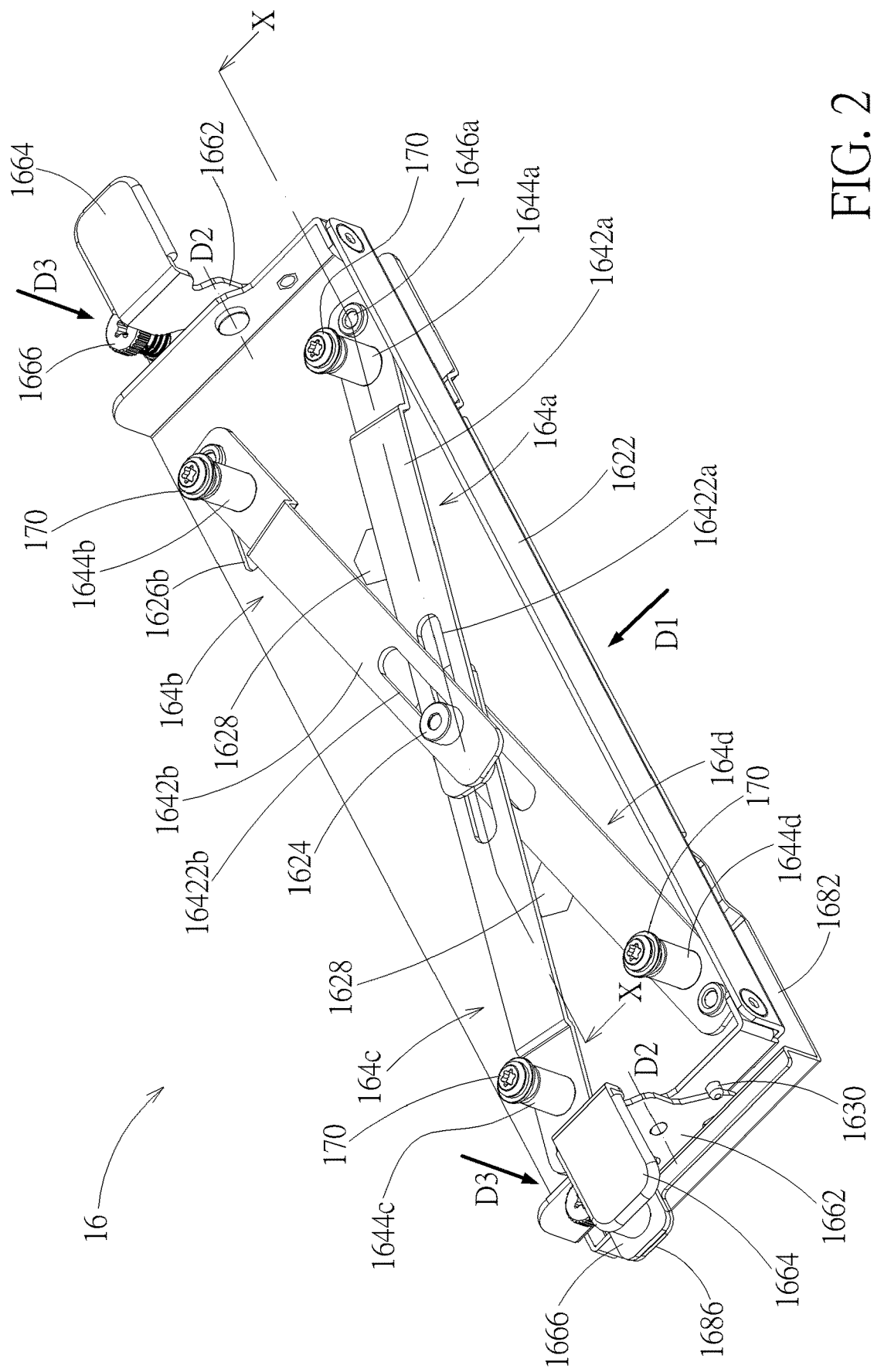
FIG. 2 is a schematic diagram illustrating a fixing device of the electronic device fixing mount in FIG. 1.
Figure 3:
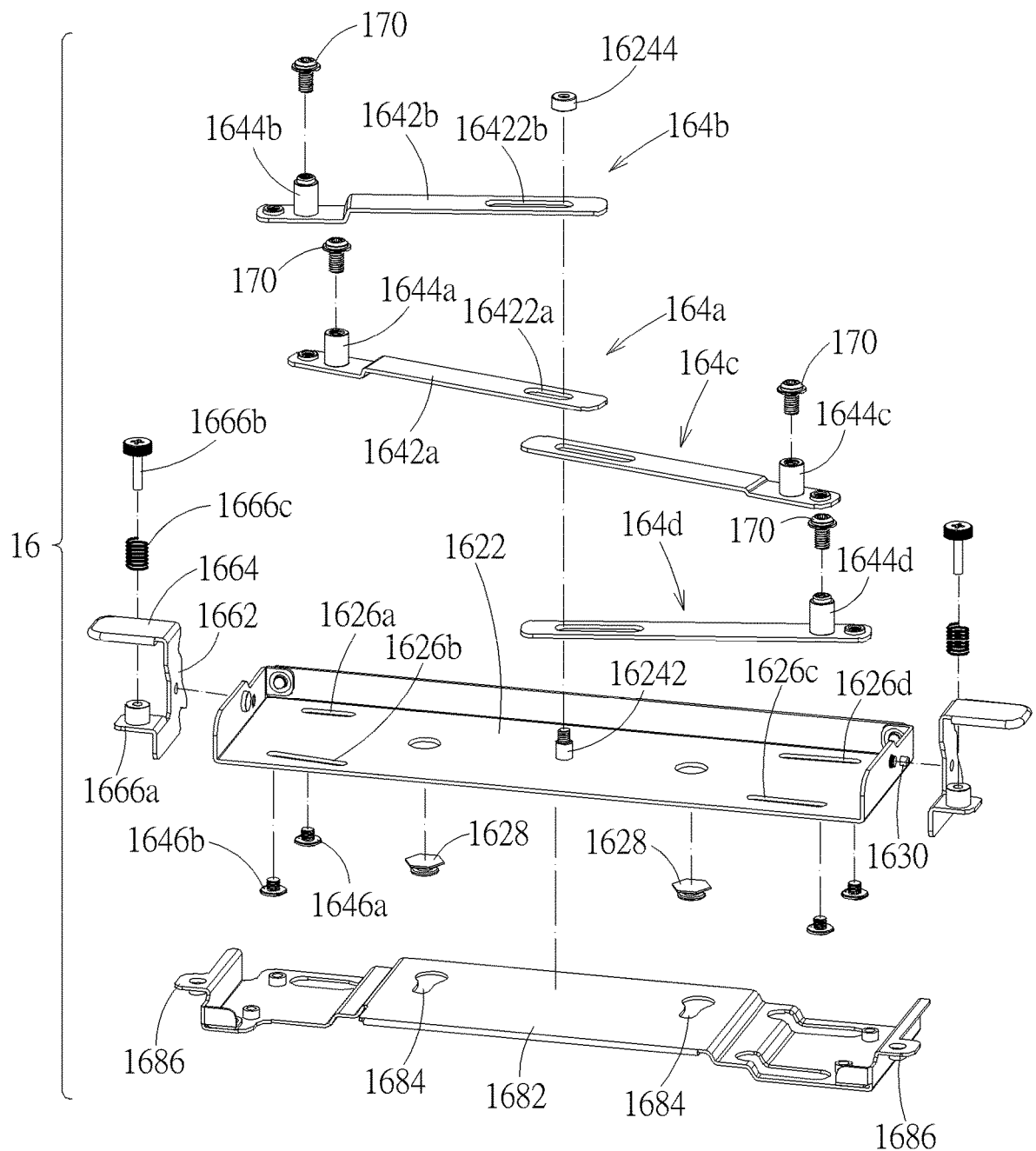
FIG. 3 is an exploded view of the fixing device in FIG. 2.

Please refer to FIG. 1 to FIG. 3. The fixing device 16 includes a carrier frame 162, four circuit board supporting structures (assigned as first to fourth circuit board supporting structures 164a, 164b, 164c and 164d respectively), two fixing parts 166, and a base 168. The first to fourth circuit board supporting structures 164a, 164b, 164c and 164d are disposed on the carrier frame 162 for supporting and fixing the circuit board 4a (referring to FIG. 4). The fixing parts 166 are disposed at two sides of the carrier frame 162. The base 168 is fixed on the bottom plate 122. The carrier frame 162 is detachably engaged to the base 168. The carrier frame 162 includes a frame body 1622 and a guiding part 1624 disposed on the frame body 1622. The frame body 1622 form first to fourth guiding slots 1626a, 1626b, 1626c and 1626d thereon, corresponding to the first to fourth circuit board supporting structures 164a, 164b, 164c and 164d respectively. In the embodiment, the first to fourth circuit board supporting structure 164a, 164b, 164c and 164d are structurally the same in logic. For descriptions about the structural details of the second to fourth circuit board supporting structure 164b, 164c and 164d and variants thereof, unless otherwise described, please refer to the relevant descriptions of the first circuit board supporting structure 164a, which will not be described in addition.

In the embodiment, the first circuit board supporting structure 164a includes a first sliding part 1642a, a first supporting part 1644a, and a first positioning part 1646a. The first sliding part 1642a has a first guided portion 16422a. The first guided portion 16422a is slidably engaged to the guiding part 1624, so that when sliding, the first sliding part 1642a can be guided by the guiding part 1624. The first supporting part 1644a and the first positioning part 1646a are disposed on the first sliding part 1642a. The first positioning part 1646a slides in the first guiding slot 1626a and can be adjustably fixed at different positions of the first guiding slot 1626a. In practice, the first supporting part 1644a can be disposed on the first sliding part 1642a by riveting, screwing with threads, or other fixing ways. Thereby, the position of the first supporting part 1644a relative to the carrier frame 162 can be adjusted by sliding the first sliding part 1642a. Then the position of the first supporting part 1644a can remain immovable by fixing the first positioning part 1646a in the first guiding slot 1626a again. In the embodiment, the first guiding slot 1626a and the first supporting part 1644a are disposed separately. Furthermore, the guiding part 1624 includes a guiding post 16242 and a limitation part 16244. The guiding post 16242 is fixed on the frame body 1622. The limitation part 16244 is screwed onto the guiding post 16242. The first guided portion 16422a is a sliding slot, through which the guiding post 16242 passes so that when sliding, the first sliding part 1642a can be guided by the guiding post 16242. The first positioning part 1646a is a screw that passes through the first guiding slot 1626a and is screwed onto the first sliding part 1642a. This structural configuration can achieve both guiding and fixing.

Figure 4:
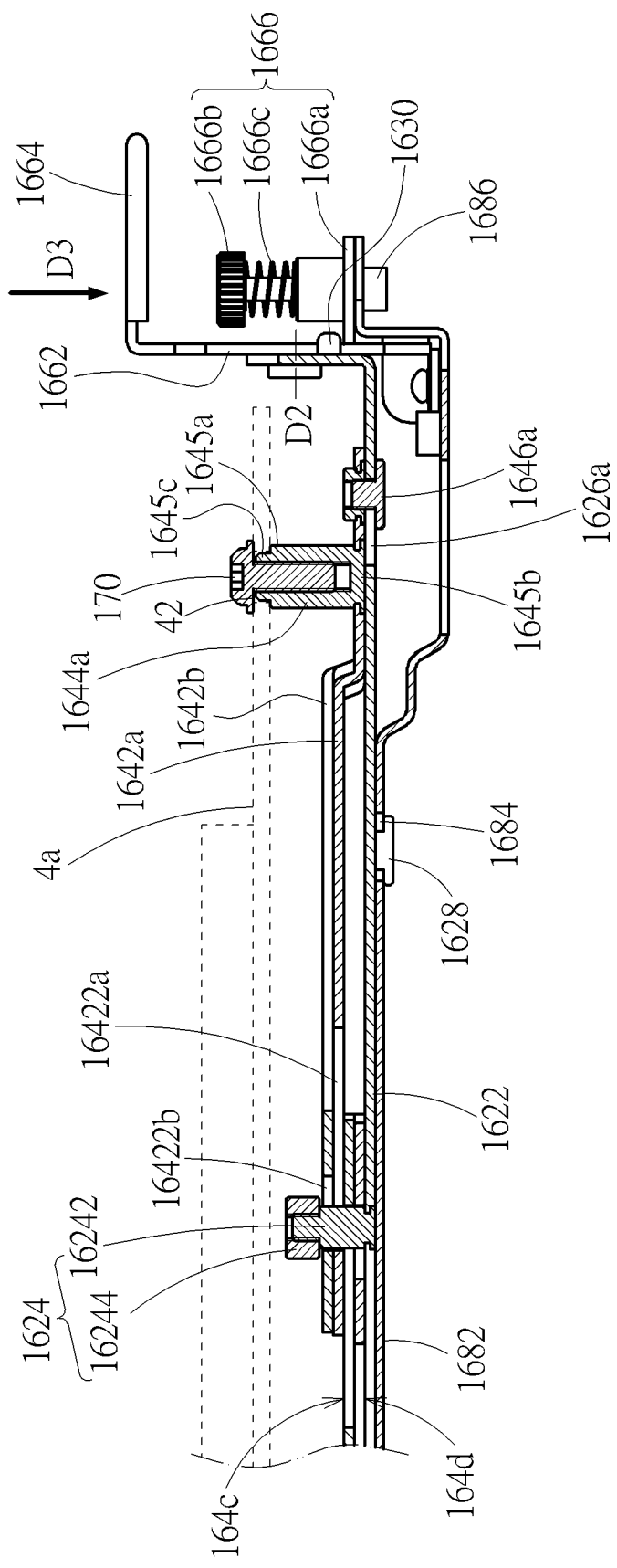
FIG. 4 is a sectional view of the fixing device along the line X-X in FIG. 2.
Figure 5:
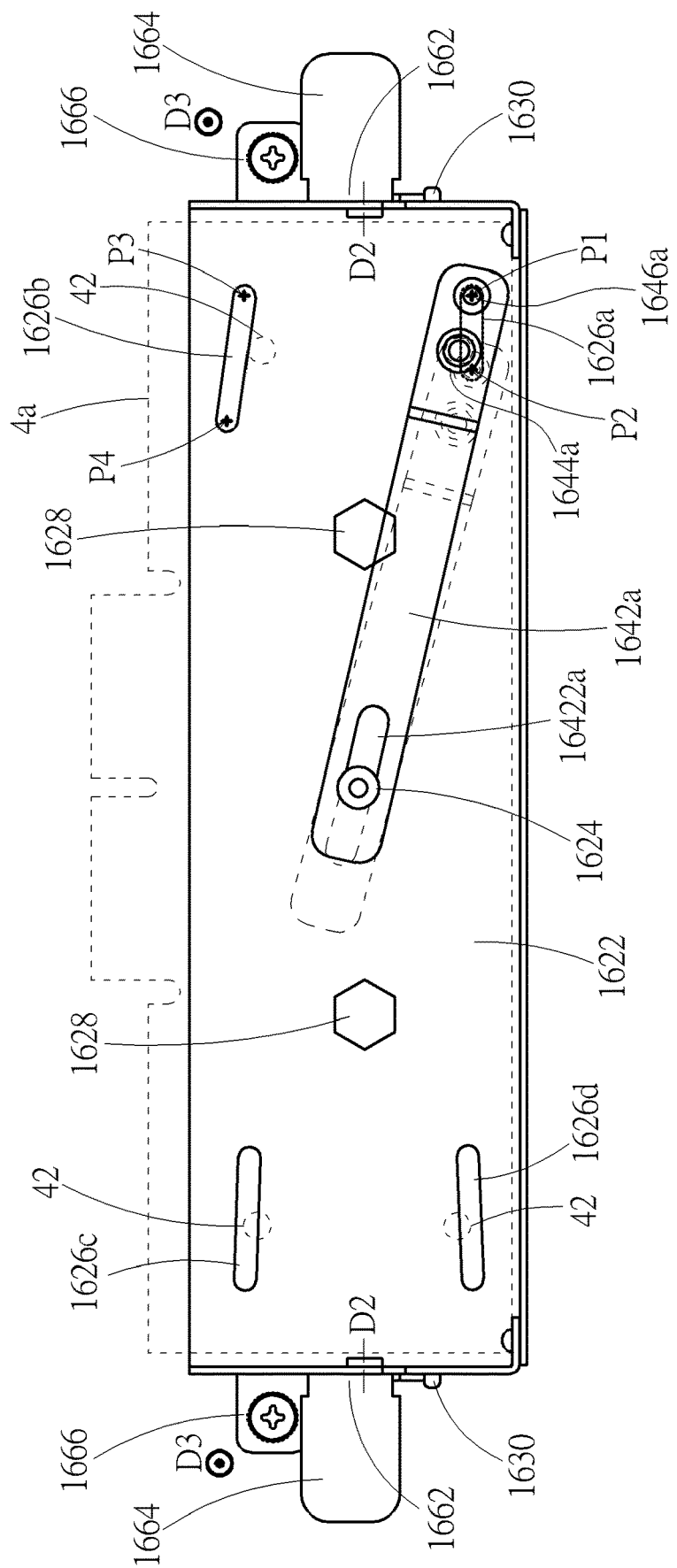
FIG. 5 is a schematic diagram illustrating an adjustment of a first circuit board supporting structure of the fixing device relative to a carrier frame.

Please also refer to FIG. 4 and FIG. 5. Therein, the profile of the circuit board 4a is shown in dashed lines in FIG. 4. FIG. 5 shows the adjustment only of the first circuit board supporting structure 164a relative to the carrier frame 162. In the adjustment to the position of the first supporting part 1644a, the first positioning part 1646a is loosened to allow the guiding part 1624 to slide in the first guided portion 16422a to drive the first sliding part 1642a. After the first sliding part 1642a is moved to a required position, the first positioning part 1646a can be screwed tight again so as to fix the first supporting part 1644a; therein, the adjusted first circuit board supporting structure 164a is shown in dashed lines in FIG. 5. In practice, the above position adjustment also can be achieved by designing the structure of the first guiding slot 1626a and by use of the properties thereof. In the embodiment, the first guiding slot 1626a is a sliding slot with two closed ends. One of the closed ends can be designed as a first position P1 (indicated by a cross mark in FIG. 5); the other one can be designed as a second position P2 (indicated by a cross mark in FIG. 5). According to this design, the first positioning part 1646a can be located precisely at the first position P1 or the second position P2 by pushing the first positioning part 1646a against the closed ends of the first guiding slot 1626a. Similarly, it is practicable to limit the relatively sliding range of the first sliding part 1642a by designing the sliding slot length of the first guided portion 16422a, so as to perform the above position adjustment. In the embodiment, when the first positioning part 1646a is located at the first position P1, the guiding post 16242 is located at one closed ends of the sliding slot. When the first positioning part 1646a is located at the second position P2, the guiding post 16242 is located at the other closed end of the sliding slot.

In practice, the above two structural designs for convenience of adjusting the position of the first positioning part 1646a can be but not limited to alternatively adopted. Furthermore, in practice, the first guiding slot 1626a is not limited to extend straight. The first guiding slot 1626a also can be achieved by a sliding slot that extends along a polygonal path, a cure path, or along other paths (e.g. X-shaped, Y-shaped, square, rectangular, triangular paths and so on). The latter ones can offer more closed ends, which is convenient to adjust the first positioning part 1646a to a plurality positions. In addition, in the embodiment, the first supporting part 1644a is located between the first positioning part 1646a and the first guided portion 16422a (or the guiding part 1624), which is conducive to the location precise of the first supporting part 1644a relative to the frame body 1622. Furthermore, in the embodiment, the first supporting part 1644a and the first positioning part 1646a are not disposed coaxially, which is conducive to the design flexibility of the fixing device 16. In another embodiment, the first positioning part 1646a and the first supporting part 1644a can be disposed coaxially (not shown by a figure). For example, it is practicable to attach a fixing screw 170 and the first positioning part 1646a to the up and down ends of the first supporting part 1644a respectively.

Please refer to FIG. 1 to FIG. 4. In the embodiment, the second circuit board supporting structure 164b includes a second sliding part 1642b, a second supporting part 1644b, and a second positioning part 1646b. The second sliding part 1642*b* has a second guided portion 16422*b* and is slidably engaged with the guiding part 1624. The second supporting part 1644*b* and the second positioning part 1646*b* are disposed on the second sliding part 1642*b*. The second positioning part 1646*b* slides in the second guiding slot 1626*b*. The second guided portion 16422*b* is a sliding slot. The guiding post 16242 passes through the sliding slot, so that when sliding, the second sliding part 1642*b* can be guided by the guiding post 16242. Furthermore, the first guided portion 16422*a* and the second guided portion 16422*b* overlap at the guiding post 16242. Thereby, the first sliding part 1642*a* and the second sliding part 1642*b* can slide parallel to the frame body 1622 and keep contacting the frame body 1622, which is conducive to the sliding stability and the structural strength. In the embodiment, the first sliding part 1642*a* and the second sliding part 1642*b* are provided in form of but not limited to a Z-shaped (or stepped) stamping plate. In the embodiment, the second circuit board supporting structure 164*b* is disposed above the first circuit board supporting structure 164*a*. In another embodiment, the second circuit board supporting structure 164*b* can be disposed on the first circuit board supporting structure 164*a* along a diagonal line. A circuit board can be fastened thereto by these two attachments without rotating or shifting. The figures shows there are four circuit board supporting structures, but the quantity is not limited thereto in practice.

In FIG. 4, the circuit board 4*a* is fastened onto the first to fourth supporting part 1644*a*, 1644*b*, 1644*c* and 1644*d* with fixing screws 170. In the embodiment, the first supporting part 1644*a* as a whole shows a post with a threaded hole and has a free end 1645*a*, a fixed end 1645*b*, and a raised portion 1645*c* at the free end 1645*a*. The first supporting part 1644*a* is fixed on the first sliding part 1642*a* through the fixed end 1645*b* and supports the circuit board 4*a* through the free end 1645*a*. The raised portion 1645*c* matches in profile with a fixing hole 42 of the circuit board 4*a*, which facilitates the placement of the circuit board 4*a* on the first supporting part 1644*a*; however, in practice, it is not limited thereto. For example, a copper post having no raised portions also can be used as the first supporting part 1644*a*. The raised portion 1645*c* is not limited to have a round shape. The first to fourth supporting parts 1644*a*, 1644*b*, 1644*c* and 1644*d* are not limited to be provided in form of the same copper post.

Figure 6:
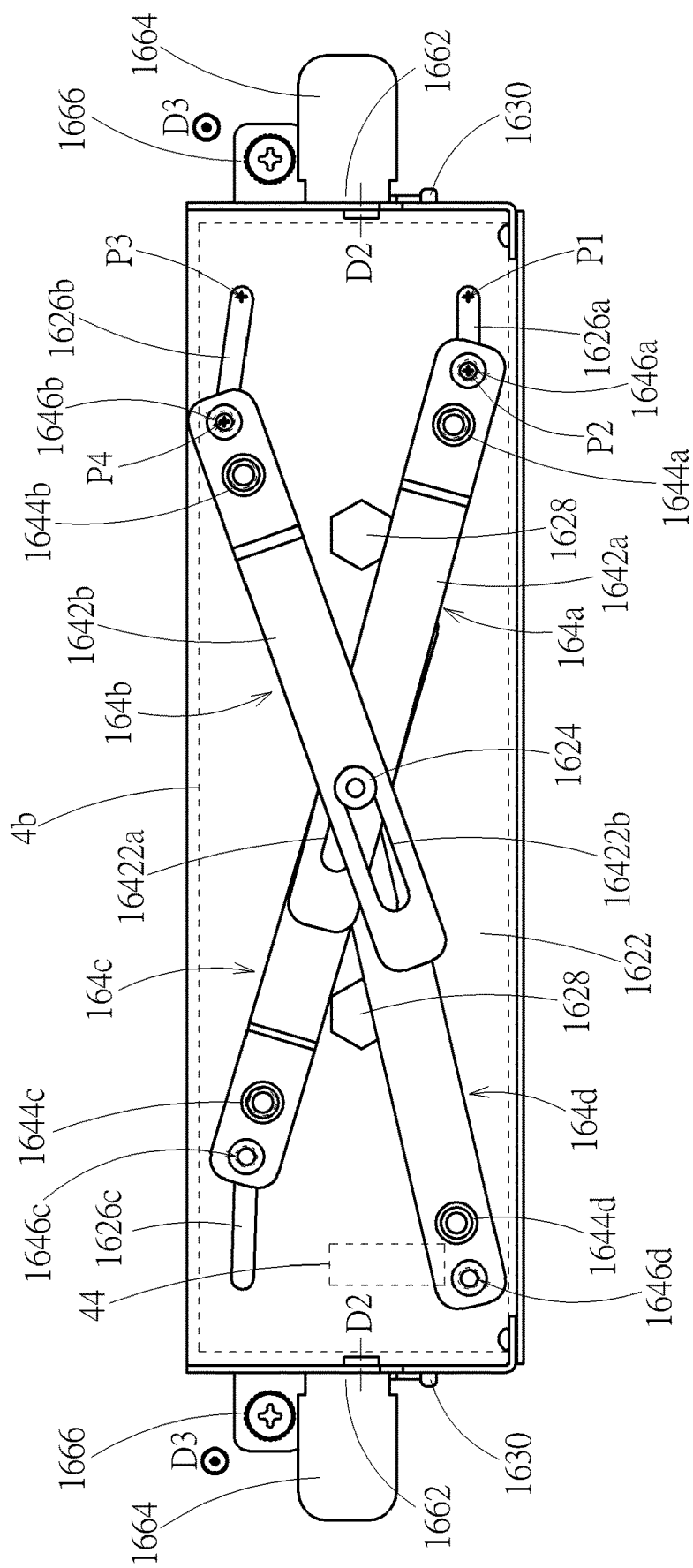
FIG. 6 is a schematic diagram illustrating the fixing device with a plurality of adjusted circuit board supporting structure.

Please refer to FIG. 6, in which the first to third circuit board supporting structures 164*a*, 164*b* and 164*c* are adjusted. Therein, for example, the first positioning part 1646*a* is adjusted from the first position P1 to the second position P2; the second positioning part 1646*b* is adjusted from a third position P3 to a fourth position P4 (in which the positions P1, P2, P3 and P4 are indicated by cross marks in FIG. 6). Thereby, after adjusted, the first to fourth supporting parts 1644*a*, 1644*b*, 1644*c* and 1644*d* can offer different position combinations of the fixing holes. In the embodiment, a circuit board 4*b* (of which the profile is shown in dashed lines in FIG. 6) has three fixing holes. The fourth circuit board supporting structure 164*d* does not need to be used, so an adjustment to the fourth circuit board supporting structure 164*d* is unnecessary. Furthermore, the fourth supporting part 1644*d* can be detached accordingly or replaced with a copper post having no raised portions so as not to structurally interfere with the circuit board 4*b*. Furthermore, in the embodiment, the circuit board 4*b* is connected to the connection module 14 not through a card edge connector but through a cable (which connects a connector 44 of the circuit board 4*b* and a connector 148 of the connection module 14).

Please refer to FIG. 2 and FIG. 3. Furthermore, in the embodiment, the base 168 includes a base body 1682 and two first slidably engaging portions 1684 and two first joining portions 1686 which are disposed on the base body 1682. The first slidably engaging portion 1684 is provided by a sliding slot with an expanded opening that is formed on the base body 1682 and extends along a slidingly engaging direction D1 (indicated by an arrow in FIG. 3). In practice, the first slidably engaging portion 1684 also can be provided by an open slot. The two first joining portions 1686 are disposed at two opposite sides of the base body 1682 relative to the slidingly engaging direction D1. The carrier frame 162 includes two second slidably engaging portions 1628 disposed on the frame body 1622. The two second slidably engaging portions 1628 can be slidably engaged with the two first slidably engaging portions 1684 in the slidingly engaging direction D1. In the embodiment, the second slidably engaging portion 1628 is provided by a T-shaped guiding post (e.g. fastened to the bottom of the frame body 1622 by riveting or screwing with threads), of which the head can pass through the expanded opening of the first slidably engaging portion 1684 so that the second slidably engaging portions 1628 and the first slidably engaging portions 1684 can slidably engage with each other.

Figure 7:
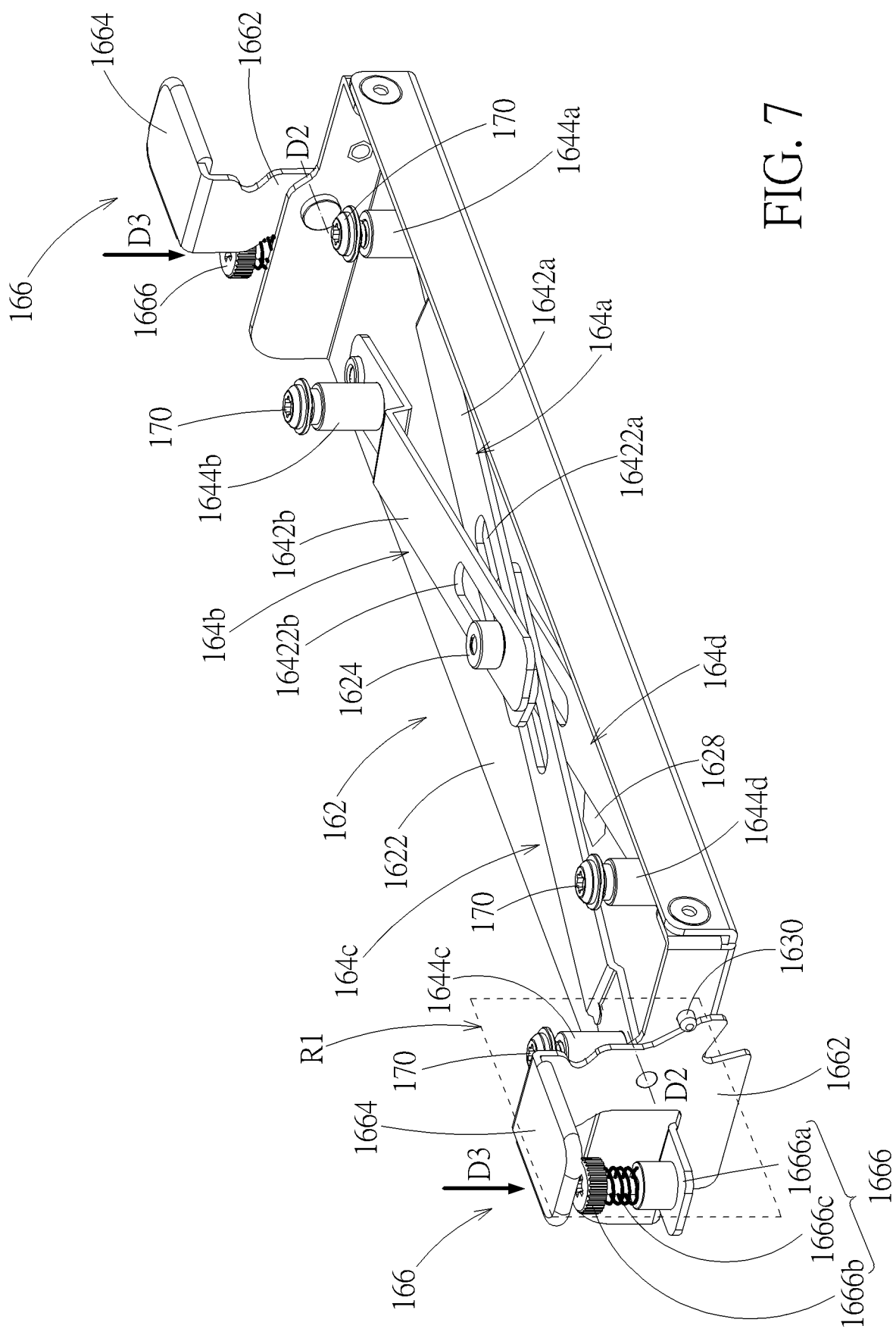
FIG. 7 is a schematic diagram illustrating the fixing device with a fixing part at a joining status.
Figure 8:
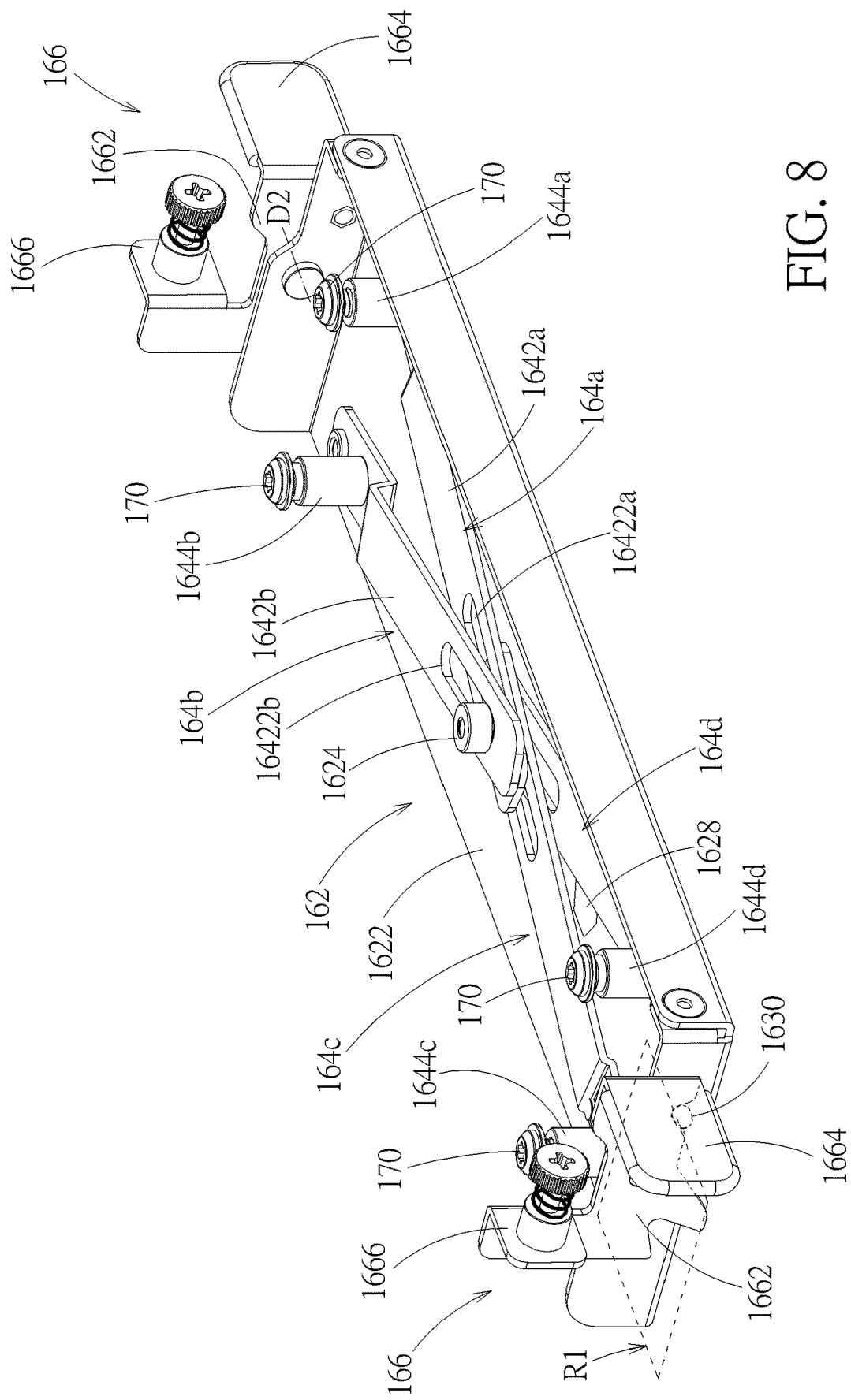
FIG. 8 is a schematic diagram illustrating the fixing device in FIG. 7 with the fixing part at a disengaging status.

Please also refer to FIG. 7 and FIG. 8. The fixing part 166 includes a pivotal connection portion 1662, a manipulation portion 1664, and a second joining portion 1666. The fixing part 166 is pivotally connected through the pivotal connection portion 1662 to the frame body 1622 of the carrier frame 162 relative to a pivotal connection axis D2 (indicated by a chain line in FIG. 7 and FIG. 8) perpendicular to the slidingly engaging direction D1. The manipulation portion 1664 and the second joining portion 1666 are connected individually to the pivotal connection portion 1662. The manipulation portion 1664 extends along the pivotal connection axis D2. The fixing part 166 is rotatable through the pivotal connection portion 1662 relative to the carrier frame 162 so that the second joining portion 1666 can be joined with or departed from the first joining portion 1686 (please also referring to FIG. 3 and FIG. 4). In the embodiment, the first joining portion 1686 is a threaded hole. The second joining portion 1666 includes an abutting portion 1666*a*, a screw 1666*b*, and a restoration spring 1666*c* abutting against and between the abutting portion 1666*a* and the screw 1666*b*. However, it is not limited thereto in practice. For example, the first joining portion 1686 and the second joining portion 1666 are joined through structural engagement. For another example, the second joining portion 1666 is an elastic hook. The first joining portion 1686 can be a plate edge capable of being hooked by the elastic hook. The joining of the first joining portion 1686 with the second joining portion 1666 can be achieved by the elastic hook hooking the plate edge.

Figure 9:
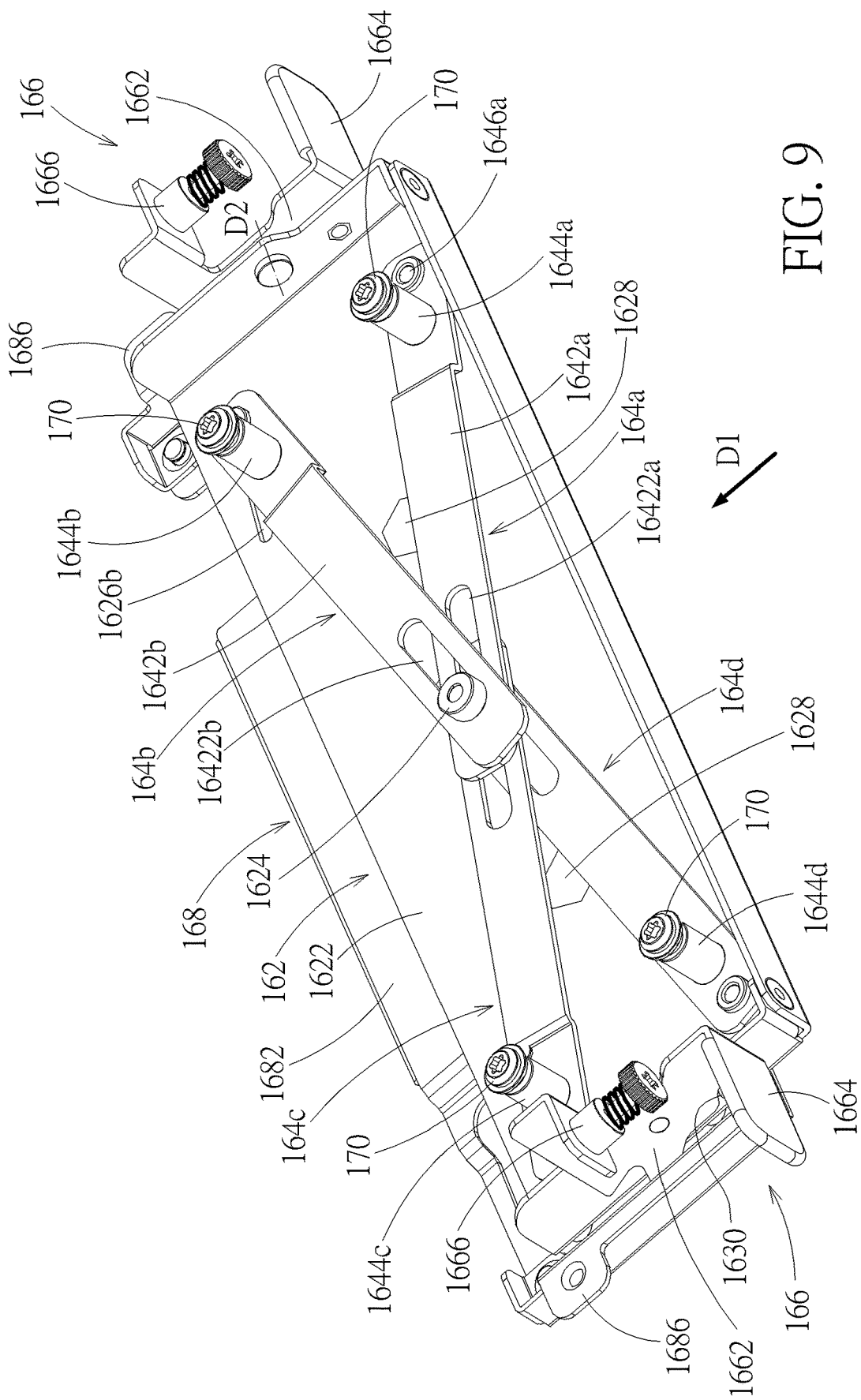
FIG. 9 is a schematic diagram illustrating the carrier frame placed on a base for being assembled to the base.

In the embodiment, the fixing part 166 can rotate relative to the carrier frame 162 through the pivotal connection portion 1662 to be at a joining status (as shown by FIG. 7) or a disengaging status (as shown by FIG. 8). A reference plane R1 (indicated by a dashed rectangle in FIG. 7 and FIG. 8) is defined to pass through the manipulation portion 1664 and the pivotal connection axis D2. Please also refer to FIG. 9. When the carrier frame 162 is ready to be assembled to the base 168, a user can make the fixing part 166 at the disengaging status (e.g. by rotating the fixing part 166 relative to the carrier frame 162) and make the second slidably engaging portion 1628 align with the first slidably engaging portion 1684 (e.g. by moving the head of the T-shaped guiding post through the expanded opening of the first slidably engaging portion 1684). At this time, as shown by FIG. 9, the fixing part 166 is at the disengaging status. The reference plane R1 is parallel to the slidingly engaging direction D1.

Afterwards, the user can push the manipulation portions 1664 located at the two sides of the carrier frame 162 to easily slide the carrier frame 162 on the base 168 in the slidingly engaging direction D1 (i.e. the second slidably engaging portion 1628 sliding in the sliding slot of the first slidably engaging portion 1684). The pushing is also conducive to insertion of the circuit board 4a of the carrier frame 162 into the connector 146. After the carrier frame 162 moves relative to the base 168 to a predetermined position (as shown by FIG. 8, e.g. by designing the sliding slot length of the first slidably engaging portion 1684 so as to make the closed end correspond to the predetermined position), the connection of the circuit board 4a with the connector 146 is achieved. At this time, the first joining portion 1686 is still not joined with the second joining portion 1666 yet. Then, the user can make the fixing part 166 at the joining status first (e.g. by rotating the fixing part 166 relative to the carrier frame 162), so that the abutting portion 1666a (of the second joining portion 1666) aligns with the first joining portion 1686. At this time, as shown by FIG. 7, the abutting portion 1666a abuts against the first joining portion 1686. The reference plane R1 is perpendicular to the slidingly engaging direction D1. Then, the user can screw the screw 1666b into the threaded hole (i.e. the first joining portion 1686) along a joining direction D3 (indicated by an arrow in FIG. 7), so that the carrier frame 162 is fixed on the base 168 (as shown by FIG. 1).

Afterwards, when the carrier frame 162 is ready to depart from the base 168, the user can loosen the screw 1666b from the threaded hole (as shown by FIG. 7) and then rotate the fixing part 166 relative to the carrier frame 162 so as to make the fixing part 166 at the disengaging status (as shown by FIG. 8). At this time, the second joining portion 1666 departs from the first joining portion 1686. The reference plane R1 is parallel to the slidingly engaging direction D1. Then, the user can pull the manipulation portion 1664 to easily slide the carrier frame 162 on the base 168 in the direction opposite to the slidingly engaging direction D1 (as shown by FIG. 9), so as to depart the second slidably engaging portion 1628 from the first slidably engaging portion 1684, so that the carrier frame 162 departs from the base 168.

Furthermore, in the embodiment, as shown by FIG. 7 and FIG. 8, the carrier frame 162 further includes two limitation portions 1630 disposed close to the two fixing parts 166 respectively. The limitation portion 1630 is provided by a stopping post riveted to the frame body 1622. In practice, a structure protruding (or extending) from the frame body 1622 also can be used as the limitation portion 1630. When the fixing part 166 is at the disengaging status, the pivotal connection portion 1662 abuts against the corresponding limitation portion 1630. For example, the pivotal connection portion 1662 uses a notch edge thereof to abut against the corresponding limitation portion 1630 (as shown by FIG. 8 and FIG. 9). When the fixing part 166 is at the joining status, the pivotal connection portion 1662 also abuts against the corresponding limitation portion 1630. For example, the pivotal connection portion 1662 uses another notch edge thereof to abut against the corresponding limitation portion 1630 (as shown by FIG. 7). Therefore, the limitation portion 1630 is conducive to locating the fixing part 166 at the joining status and the disengaging status. However, it is not limited thereto in practice.

In addition, in the embodiment, the fixing device 16 uses the four circuit board supporting structures 164a, 164b, 164c and 164d, which are adjustable; however, it is not limited thereto in practice. For example, the fixing device 16 can use more or less circuit board supporting structures. Therein, only some of the circuit board supporting structures are adjustable, and the rest is provided in form of an un-adjustable structure (e.g. a copper post that is riveted or screwed to the frame body 1622 and has a threaded hole, or other fixing and supporting structure).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A fixing device, comprising:
a carrier frame, the carrier frame comprising a guiding part and a first guiding slot;
a first circuit board supporting structure, the first circuit board supporting structure being disposed on the carrier frame and comprising a first sliding part, a first supporting part, and a first positioning part, the first sliding part having a first guided portion, the first guided portion being slidably engaged with the guiding part, the first supporting part and the first positioning part being disposed on the first sliding part, the first positioning part sliding in the first guiding slot and being adjustably fixed at a first position or a second position of the first guiding slot; and
a base, slidably engaged with the carrier frame, the base having a first slidably engaging portion, the carrier frame comprising a second slidably engaging portion, the second slidably engaging portion being slidably engaged with the first slidably engaging portion in a slidingly engaging direction.
2. The fixing device according to claim 1, wherein the guiding part comprises a guiding post, the first guided portion is a sliding slot, and the guiding post passes through the sliding slot.
3. The fixing device according to claim 1, wherein the first position is located at a closed end of the first guiding slot, and the second position is located at another closed end of the first guiding slot.
4. The fixing device according to claim 1, wherein the first supporting part is located between the first positioning part and the first guided portion.
5. The fixing device according to claim 1, wherein the guiding part comprises a guiding post, the first guided portion is a sliding slot, the guiding post passes through the sliding slot, when the first positioning part is located at the first position, the guiding post is located at a closed end of the sliding slot, and when the first positioning part is located at the second position, the guiding post located at another closed end of the sliding slot.
6. The fixing device according to claim 1, further comprising a second circuit board supporting structure disposed on the carrier frame, wherein the carrier frame comprises a second guiding slot, the second circuit board supporting structure comprises a second sliding part, a second supporting part, and a second positioning part, the second sliding part has a second guided portion, the second guided portion is slidably engaged with the guiding part, the second supporting part and the second positioning part are disposed on the second sliding part, and the second positioning part slides in the second guiding slot and is adjustably fixed at a third position or a fourth position of the second guiding slot.

7. The fixing device according to claim 6, wherein the guiding part comprises a guiding post, the first guided portion is a first sliding slot, the second guided portion is a second sliding slot, the guiding post passes through the first sliding slot and the second sliding slot, and the first sliding slot and the second sliding slot overlap.

8. The fixing device according to claim 1, wherein the first supporting part has a free end and a raised portion at the free end.

9. The fixing device according to claim 1, further comprising a fixing part, wherein the base has a first joining portion, the fixing part comprises a pivotal connection portion, a manipulation portion, and a second joining portion, the pivotal connection portion is pivotally connected to the carrier frame relative to a pivotal connection axis perpendicular to the slidingly engaging direction, the manipulation portion extends along the pivotal connection axis, and the fixing part rotates relative to the carrier frame through the pivotal connection portion so as to join the second joining portion and the first joining portion or to depart the second joining portion from the first joining portion.

10. The fixing device according to claim 9, wherein the fixing part rotates relative to the carrier frame through the pivotal connection portion so as to be at a joining status or a disengaging status, a reference plane is defined as passing through the manipulation portion and the pivotal connection axis, when the first slidably engaging portion is slidably engaged with the second slidably engaging portion and is at the joining status, the reference plane is perpendicular to the slidingly engaging direction, and the second joining portion is capable of being joined with the first joining portion so as to fix the carrier frame to the base, and when the fixing part is at the disengaging status, the second joining portion departs from the first joining portion, and the reference plane is parallel to the slidingly engaging direction.

11. The fixing device according to claim 9, wherein the carrier frame comprises a limitation portion, and when the fixing part is at the disengaging status, the pivotal connection portion abuts against the limitation portion.

12. An electronic device fixing mount, comprising:
a structural frame;
a fixing device, the fixing device being disposed on the structure frame and comprising:
a carrier frame, the carrier frame comprising a guiding part and a first guiding slot;
a first circuit board supporting structure, the first circuit board supporting structure being disposed on the carrier frame and comprising a first sliding part, a first supporting part, and a first positioning part, the first sliding part having a first guided portion, the first guided portion being slidably engaged with the guiding part, the first supporting part and the first positioning part being disposed on the first sliding part, the first positioning part sliding in the first guiding slot and being adjustably fixed at a first position or a second position of the first guiding slot; and
a base, slidably engaged with the carrier frame, the base having a first slidably engaging portion, the carrier frame comprising a second slidably engaging portion, the second slidably engaging portion being slidably engaged with the first slidably engaging portion in a slidingly engaging direction; and
a connector, the connector being disposed on the structural frame close to the fixing device for connecting with a circuit board fixed on the fixing device.

13. The electronic device fixing mount according to claim 12, wherein the guiding part comprises a guiding post, the first guided portion is a sliding slot, and the guiding post passes through the sliding slot.

14. The electronic device fixing mount according to claim 12, wherein the first position is located at a closed end of the first guiding slot, and the second position is located at another closed end of the first guiding slot.

15. The electronic device fixing mount according to claim 12, wherein the guiding part comprises a guiding post, the first guided portion is a sliding slot, the guiding post passes through the sliding slot, when the first positioning part is located at the first position, the guiding post is located at a closed end of the sliding slot, and when the first positioning part is located at the second position, the guiding post located at another closed end of the sliding slot.

16. The electronic device fixing mount according to claim 12, wherein the fixing device further comprises a second circuit board supporting structure disposed on the carrier frame, the carrier frame comprises a second guiding slot, the second circuit board supporting structure comprises a second sliding part, a second supporting part, and a second positioning part, the second sliding part has a second guided portion, the second guided portion is slidably engaged with the guiding part, the second supporting part and the second positioning part are disposed on the second sliding part, and the second positioning part slides in the second guiding slot and is adjustably fixed at a third position or a fourth position of the second guiding slot.

17. The electronic device fixing mount according to claim 12, wherein the fixing device further comprises a fixing part, the base has a first joining portion, the fixing part comprises a pivotal connection portion, a manipulation portion, and a second joining portion, the pivotal connection portion is pivotally connected to the carrier frame relative to a pivotal connection axis perpendicular to the slidingly engaging direction, the manipulation portion extends along the pivotal connection axis, and the fixing part rotates relative to the carrier frame through the pivotal connection portion so as to join the second joining portion and the first joining portion or to depart the second joining portion from the first joining portion.

18. The electronic device fixing mount according to claim 17, wherein the fixing part rotates relative to the carrier frame through the pivotal connection portion so as to be at a joining status or a disengaging status, a reference plane is defined as passing through the manipulation portion and the pivotal connection axis, when the first slidably engaging portion is slidably engaged with the second slidably engaging portion and is at the joining status, the reference plane is perpendicular to the slidingly engaging direction, and the second joining portion is capable of being joined with the first joining portion so as to fix the carrier frame to the base, and when the fixing part is at the disengaging status, the second joining portion departs from the first joining portion, and the reference plane is parallel to the slidingly engaging direction.

* * * * *